Jan. 12, 1954 C. A. BERGFORS Re. 23,770

ELECTRONIC TRIGGER

Original Filed Dec. 29, 1948 4 Sheets-Sheet 1

INVENTOR
Carl A. Bergfors
BY A. J. Etienne
ATTORNEY

ELECTRONIC TRIGGER

Original Filed Dec. 29, 1948 4 Sheets-Sheet 2

INVENTOR
Carl A. Bergfors
BY A. J. Etienne
ATTORNEY

Jan. 12, 1954 C. A. BERGFORS Re. 23,770

ELECTRONIC TRIGGER

Original Filed Dec. 29, 1948 4 Sheets-Sheet 3

INVENTOR
Carl A. Bergfors
BY A. J. Etienne
ATTORNEY

ELECTRONIC TRIGGER

Original Filed Dec. 29, 1948 4 Sheets-Sheet 4

INVENTOR
Carl A. Bergfors
BY A. J. Etienne
ATTORNEY

Reissued Jan. 12, 1954 Re. 23,770

UNITED STATES PATENT OFFICE 23,770

ELECTRONIC TRIGGER

Carl A. Bergfors, Roslyn Heights, N. Y., assignor to International Business Machines Corporation, New York, N. Y., a corporation of New York Original No. 2,506,439, dated May 2, 1950, Serial No. 67,885, December 29, 1948. Application for reissue April 28, 1951, Serial No. 223,472

8 Claims. (Cl. 250—27)

Matter enclosed in heavy brackets [ ] appears in the original patent but forms no part of this reissue specification; matter printed in italics indicates the additions made by reissue.

This invention relates to trigger circuits and more particularly to a high speed trigger of the dual-tube type having two conditions of stability.

In trigger circuits of the conventional dual-tube type, the plate of each tube is connected to the control grid of the other tube. In such triggers, one of the chief limiting factors affecting the upper operating speed is the self-loading due to the cross-connected plates and grids.

Briefly, the invention employs four tubes including two tubes used as triggers and two as cathode followers. For the purpose of clarity of description, the former are referred to herein as trigger tubes and the latter as cathode follower tubes. Certain electrodes of one cathode follower tube are interposed between the plate of each trigger tube and the grid of the other trigger tube and vice versa.

Accordingly, it is a principal object of this invention to provide a novel trigger wherein the trigger performance is relatively unaffected by loading.

Another object is to provide a novel trigger of extremely high operating speed and low current consumption comprising cathode followers for cross-coupling the tubes of the trigger.

Still another object is to provide a trigger circuit operable over the range from one cycle per second to more than one megacycle per second.

A further object is to provide a high speed trigger operable over a wide range of supply voltages.

Another object is to provide novel means for reducing the effect of input capacitance of a trigger.

Still another object is to provide a novel trigger having two stable conditions and using two grid controlled tubes with the plate of each connected to the control grid of the other wherein the time constant, which determines the time required to switch the trigger from one stable condition to the other, is decreased by connecting each control grid of the tubes with a cathode of a cathode follower tube.

A further object is to provide a novel trigger having two interconnected tubes wherein the load compensating effect of the low impedance circuit of a cathode follower [in] *is* utilized to decrease the undesirable effects of heavy loading by the control grids of the tubes of the trigger.

A still further object is to provide a trigger having a pair of grid controlled tubes with the plate of each connected to the control grid of the other by means of a cathode follower.

Still another object is to provide a novel trigger comprising cross-coupled tubes, and cathode followers to reduce the effect of input capacitance of the grids of the cross-coupled tubes.

Other objects of the invention will be pointed out in the following description and claims and illustrated in the accompanying drawings, which disclose, by way of examples, the principle of the invention and the best mode, which has been contemplated, of applying that principle.

In the drawings:

Fig. 3 is a circuit diagram of another embodiment;

Throughout the drawings like parts are designated by like numerals.

Before proceeding to the description of the various embodiments, it is believed that a brief discussion of various aspects of a cathode follower circuit will greatly simplify the explanation of the advantages of applicant's novel circuits.

Figure 1:
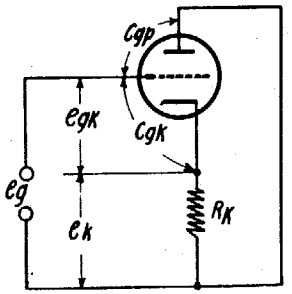
Fig. 1 is an equivalent circuit diagram of a cathode follower with a pure resistance load.
Figure 2:
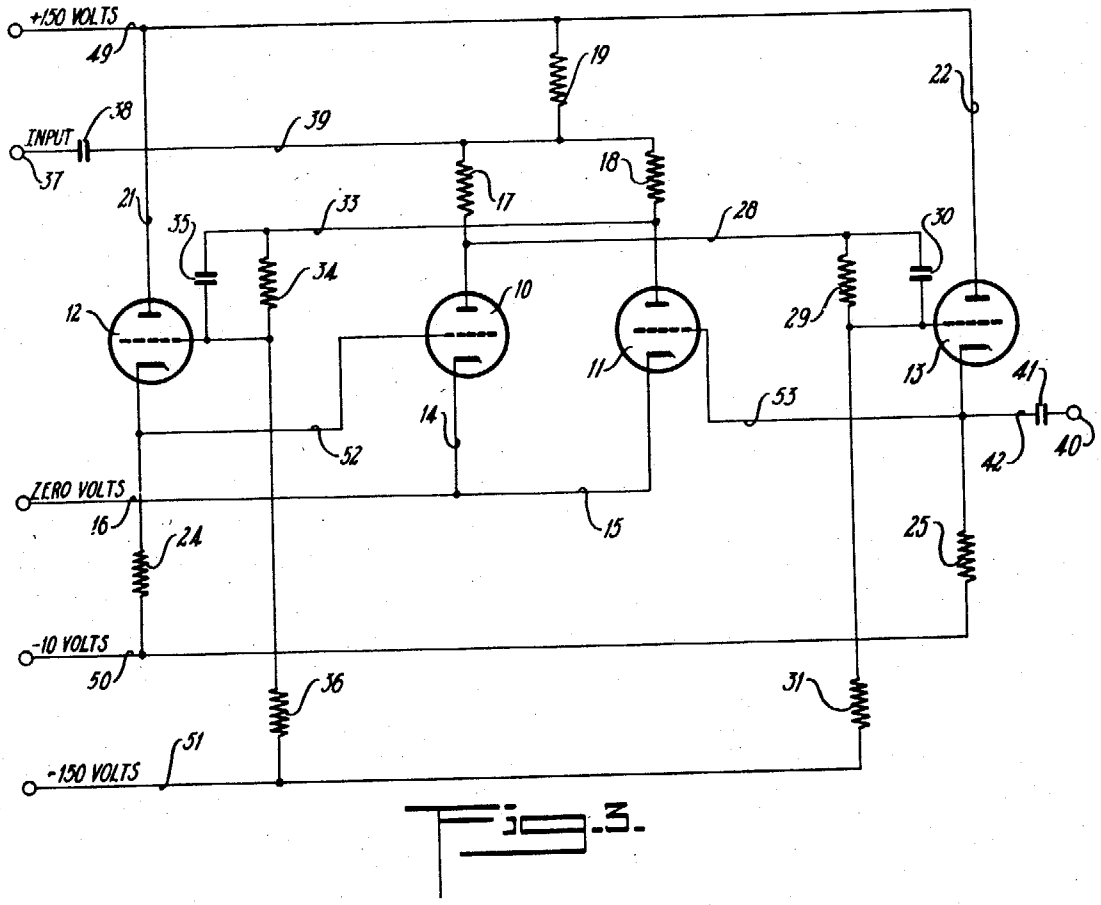

Referring to Fig. 1, there is illustrated the [equivalent] circuit diagram of a cathode follower with a pure resistance load.

By a simple mathematical analysis, an expression may be derived for the input capacitance of a cathode follower in terms of its circuit constants. In Fig. 1, the signal voltage $e_g$ is impressed on the control grid of the tube and the output voltage [$e_g$] $e_k$ appears across a cathode resistor $R_k$. The voltage between the control grid and cathode is $e_{gk}$. The capacitance between the control grid and cathode is represented by $C_{gk}$ and the capacitance between the control grid and plate is represented by $C_{gp}$.

It is fundamental that the voltage amplification of any amplifier is the ratio of the output voltage to the input voltage. Therefore, according to the designations of Fig. 1, the voltage amplification A obtained in a cathode follower is the ratio of the cathode voltage $e_k$ to the signal voltage $e_g$ or $$A=\frac{e_k}{e_g} \qquad (L)$$

Hence, transposing, $$e_k = Ae_g \qquad (M)$$

Also the control grid voltage, with respect to cathode, designated as $e_{gk}$, may be written as $$e_{gk} = e_g - e_k \qquad (N)$$

Now, substituting the value of $e_k$ express in (M) for $e_k$ in (N) the following equation is obtained:

$$e_{gk} = e_g - Ae_g \qquad (O)$$

The charge Q, across any capacitor, is equal to the value of the capacitance C times the voltage E across the capacitor; or $$Q = CE \qquad (P)$$

It follows that the charge on the control grid $Q_{gk}$ due to the grid-cathode capacitance is expressed by the following equation:

$$Q_{gk} = C_{gk}e_{gk} \qquad (Q)$$

Now, substituting the value of $e_{gk}$ of (O) in (Q)

$$Q_{gk} = C_{gk}(e_g - Ae_g) \qquad (R)$$

Also, the charge $Q_{gp}$ due to the grid-plate capacitance is expressed by the following equation:

$$Q_{gp} = C_{gp}e_g \qquad (S)$$

The total charge $Q_g$ on the control grid is equal to the sum of the charges due to the grid-cathode and grid-plate capacitances, hence by adding (R) and (S)

$$Q_g = Q_{gp} + Q_{gk} = C_{gp}\ e_g + C_{gk}\ (e_g - Ae_g) \qquad (T)$$

From (P) the capacitance C, may be written as:

$$C = \frac{Q}{E} \qquad (U)$$

It follows that the effective input capacitance of $C_g$ is obtained by dividing (T) by $e_g$ hence, $$C_g = C_{gp} + C_{gk} - AC_{gk} \qquad (V)$$

In a similar manner, there may be derived the equation for the input capacitance of a triode amplifier having a pure resistance plate load. This equation is as follows:

$$C_g = C_{gp} + C_{gk} + AC_{gp} \qquad (W)$$

Equation V indicates that the input capacitance of the cathode follower, is less than, the sum of the grid-plate and grid-cathode capacitances, by an amount equal to the voltage amplification times the grid-cathode capacitance. The substraction of the quantity $AC_{gk}$ in Equation V indicates that the cathode voltage is in phase with the signal voltage applied to the control grid of the tube. This means that the feedback voltage through the grid-cathode capacitance is in phase with and tends to sustain the impressed signal voltage. Hence, in the cathode follower circuit, the feedback through the grid-cathode capacitance is equivalent to a reduction in the input capacitance.

On the other hand, Equation W indicates that the input capacitance of a triode plate-loaded amplifier, is greater than the sum of the grid-plate and grid-cathode capacitance by an amount equal to the voltage amplification times the grid-plate capacitance. The addition of the quantity ($AC_{gp}$) indicates that the voltage applied to the control grid is 180 degrees out of phase with the plate voltage. This means that the feedback voltage through the grid-plate capacitance opposes the impressed grid voltage. Hence, in the plate-loaded amplifier circuit, the grid-plate capacitance serves to increase the total input capacitance whereas, in the cathode follower circuit, the grid-cathode capacitance is utilized to decrease the total input capacitance.

In order to more clearly understand the particular advantages obtained from the use of a cathode follower circuit, the values of input capacitances for a triode amplifier and a cathode follower, using the same type of tube, in both cases, will now be computed and compared.

The grid-cathode capacitance $C_{gk}$ of a 12AU7 type tube, including the capacitance of the socket, is approximately 1.80 micromicrofarads and the grid-plate capacitance $C_{gp}$ is approximately 1.75 micromicrofarads. The voltage amplification A of this 12AU7 tube, when used as a triode amplifier in a conventional trigger circuit is approximately 10, while the measured voltage amplification of this tube, used as a cathode follower, is 0.968. By substituting these values in Equation W the input capacitance $C_g$ of this tube, as a triode plate-loaded amplifier, is found to be 21 micromicrofarads. However, by substituting the above values in Equation V the input capacitance $C_g$ of this tube, used as a cathode follower, is found to be only 1.8 micromicrofarads.

From these computations it is seen that the input capacitance of this tube, as used in the conventional trigger, is almost twelve times that of this same tube as used in the cathode follower circuit. Hence, by connecting the plates of each trigger tube to the control grids of the cathode follower tubes, respectively, the capacitative load on the plates of the trigger tubes will be decreased by a factor of twelve. Also, since the cathode follower grid is driven only slightly positive with respect to cathode, loading due to grid current is reduced to a negligible quantity.

Further, the resistive component of load coupled to each other of the trigger tubes when employed with a cathode follower is 970,000 ohms as compared with 400,000 ohms when using a conventional trigger. Hence, the plate current loads, which, it is to be noted, are inversely proportional to the resistive components, are in the ratio of 2.4 to 1 between the conventional trigger and the novel cathode follower trigger of applicant's device.

The effective output impedance of 12AU7 tubes employed as cathode followers can be shown to be approximately 360 ohms and since it is only 360 ohms, it is obvious that the trigger grids, although presenting relatively heavy loading, can easily be driven from the low impedance source. In other words, the current flowing in the cathode follower from its plate to cathode automatically adjusts itself to provide a substantially constant value of output voltage, notwithstanding the load presented by the control grid of the trigger tube.

Another important advantage of the cathode follower coupled trigger is that the trigger grids are effectively in parallel with the cathode follower tube cathodes. Thus the effective time constant of the trigger tube grid circuit is reduced permitting operation at higher pulsing rates.

Figure 2:
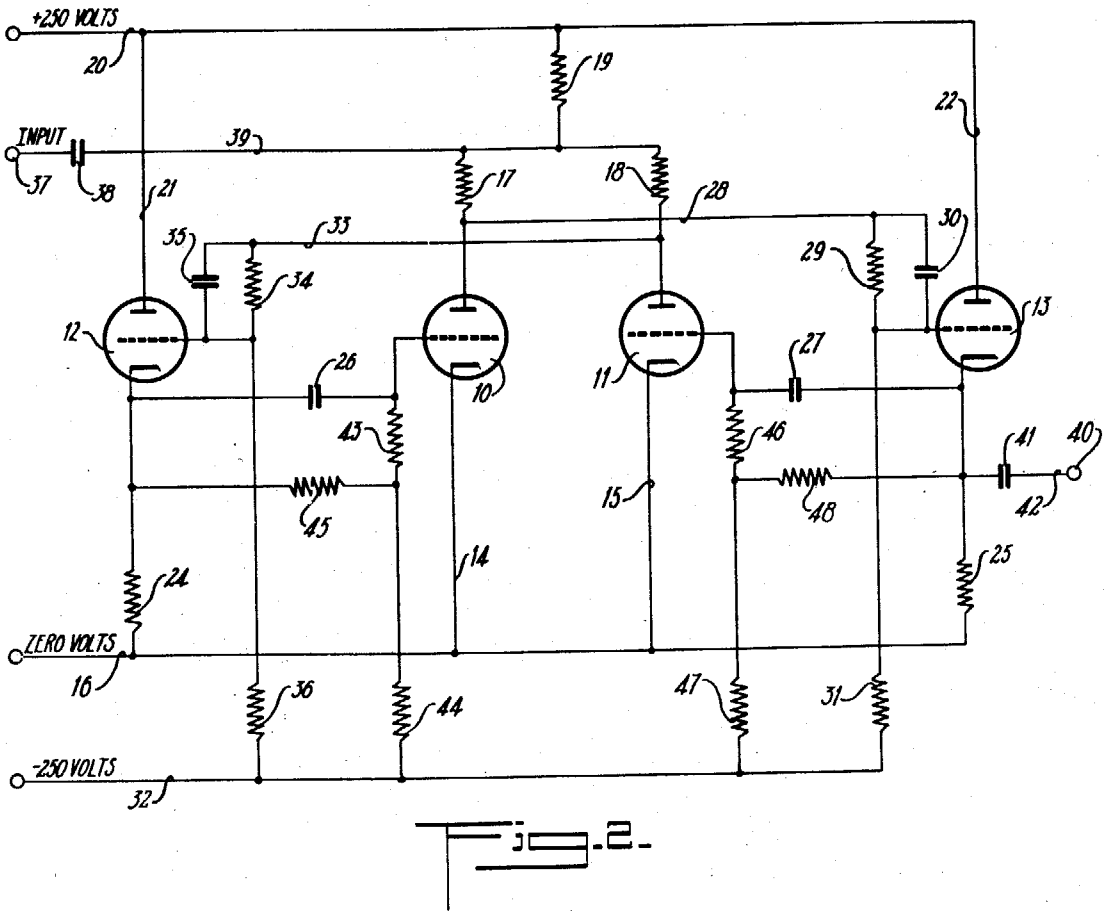
Fig. 2 is a circuit diagram of one embodiment of a high speed trigger.

Now referring more particularly to Fig. 2, the novel trigger device is shown, for example, as comprising trigger tubes 10 and 11 and cathode follower tubes 12 and 13. These tubes are actually sections of a 12AU7 miniature twin triode type tube but will be referred to herein, as tubes, to facilitate the description.

The cathodes of the tubes 10 and 11 are connected through conductors 14 and 15, respectively, to a zero volt line 16. The plates of the tubes 10 and 11 are connected through resistors 17 and 18, respectively, each of 20,000 ohms and also through a resistor 19 of 15,000 ohms to a plus 250 volt line 20.

The plates of the cathode follower tubes 12 and 13 are connected to the plus 250 volt line 20 through conductors 21 and 22, respectively, and their cathodes are connected to the zero volt line 16, through resistors 24 and 25 respectively, each of 24,000 ohms. The cathode of tube 12 is coupled to the control grid of tube 10 through a capacitor 26 of 0.00005 microfarad and the cathode of tube 13 is coupled to the control grid of tube 11 through a capacitor 27 of 0.00005 microfarad.

The plate of tube 10 is connected also, through a conductor 28 and parallel connected resistor 29, of 220,000 ohms, and capacitor 30, of 0.00005 microfarad, to the control grid of tube 13. The control grid of tube 13 is connected through a resistor 31 of 750,000 ohms to a minus 250 volt line 32. The plate of tube 11 is similarly connected through a conductor 33 and parallel connected resistor 34, of 220,000 ohms, and capacitor 35, of 0.00005 microfarad, to the control grid of tube 12. The control grid of tube 12 is connected through a resistor 36 of 750,000 ohms to the minus 250 volt line 32.

Input terminal 37 is coupled through a capacitor 38 of 0.00025 microfarad and a conductor 39 to the junction of the resistors 17 and 18 with the resistor 19. The output terminal 40 is coupled through a capacitor 41 of 0.00025 microfarad and a conductor 42 to the cathode of tube 13. The grid of tube 10 is connected by resistors 43 and 44 of 20,000 ohms and 250,000 ohms, respectively to the minus 250 volt line 32. The cathode of tube 12 is connected to the control grid of tube 10 through a resistor 45 of 36,000 ohms connected to the junction of resistors 43 and 44. Similarly the control grid of tube 11 is connected through resistors 46 and 47 of 20,000 and 240,000 ohms, respectively, to the minus 250 volt line 32. The cathode of tube 13 is connected to the control grid of tube 11 through a resistor 48 of 36,000 ohms connected to the junction of the resistors 46 and 47.

While no reset means are shown, it is to be understood that such may be provided in any conventional manner and in accordance with the particular use to which the trigger is to be put. The trigger, as illustrated, when energized, will assume, by chance, one of its two stable conditions. For the purposes of explanation, it is assumed that tubes 10 and 12 are initially non-conductive and tubes 11 and 13 conductive. This initial stable condition is referred to herein as the "on" condition. When tubes 10 and 12, become conductive, and tubes 11 and 13 non-conductive, the trigger is in its other stable condition, designated herein as the "off" condition.

When the trigger is "on," the potential at the plate of tube 11 is low and is transferred over the conductor 33 to the resistors 34 and 36. The consequent low potential present at the junction of resistors 34 and 36 is applied to the control grid of the cathode follower tube 12, connected thereto and is sufficient to maintain that grid below cutoff potential thereby rendering tube 12 non-conductive. The potential at the cathode of this tube and at the control grid of tube 10 is determined by the voltage divider consisting of the resistors 24, 45 and 44 connected between the zero volt line 16 and the minus 250 volt line 32. The voltage at the control grid of tube 10 is sufficiently negative to hold it below cutoff, to thus render it non-conductive. The resulting high potential at the plate of the tube 10 is transferred over the conductor 28 to the resistors 29 and 31. The consequent high potential present at the junction of the resistors 29 and 31 is transferred to the control grid of tube 13, connected thereto and renders that tube conductive. With this cathode follower tube 13 conducting, its cathode potential is relatively high, as compared to that of tube 12, and the potential transferred to the control grid of tube 11 is sufficient to keep it conductive. Thus the trigger remains "on" until the potential conditions are changed by application of a negative pulse to input terminal 37.

A series of negative pulses are applied across the input terminal 37 and the zero volt line 16. These pulses are of sufficient amplitude and steep wave front to effect switching from either "on" or "off," to the other condition. The trigger illustrated is non-responsive to positive pulses of the same amplitude as that of the negative pulses.

While it is shown that switching of the trigger is obtained by supplying pulses to the plate circuit of the trigger tubes, such does not constitute part of novelty of this device. It is understood that the trigger may be switched by applying pulses to the control grids of the trigger tubes or in any other conventional manner.

Assuming, as stated above, that the trigger is "on," the first negative pulse applied, over the input terminal 37, capacitor 38 and line 39, to the junction of the resistors 17 and 18 with the resistor 19, suddenly reduces the voltages on the plates of tubes 10 and 11. When the voltage on the plate of tube 11 thus momentarily decreases, a negative pulse is transferred over the conductor 33 and the parallel connected resistor 34 and capacitor 35, to the control grid of the cathode follower tube 12 but since this tube is already non-conductive, this negative pulse has no effect.

At the same time, a negative pulse is transferred from the plate of the tube 10 over the conductor 28 and the parallel connected resistor 29 and capacitor 30 to the control grid of the cathode follower tube 13. The control grid voltage of the cathode follower tube 13 is driven beyond the cutoff value by this negative pulse and a steep negative pulse is produced at its cathode. This steep negative pulse is transferred to the control grid of the conducting trigger tube 11 driving it beyond cutoff, and thus all four tubes 10, 11, 12 and 13 are momentarily non-conductive which comprises a very unstable condition. Since the trigger tubes 10 and 11 are both momentarily non-conductive, their anodes at this instant are at high potential causing the voltages on the control grids of the cathode follower tubes 12 and 13 to rapidly rise exponentially toward a final value.

When the voltage on the control grid, of the originally non-conductive tube 12, starts its exponential rise, it starts from a value of minus 40 volts and, if allowed to continue, would reach a value of approximately a plus 87 volts. At the same time, the voltage on the control grid of the originally conductive tube 13 is plus 40 volts and if allowed to continue to rise would reach a value of plus 60 volts. In other words the voltage differential of the control grid of tube 12 is 127 volts while that of tube 13 is only 20 volts.

*Since the voltage differential on the grid of the initially non-conducting tube is several times*

*greater than the voltage differential appearing at the grid of the initially conducting tube, the voltage at the grid of the initially non-conducting tube will reach critical bias value first because the time constants of both circuits are substantially equal. Thus the trigger will reverse its stable condition in response to each input pulse applied rather than return to its former stable condition.*

Figure 5:
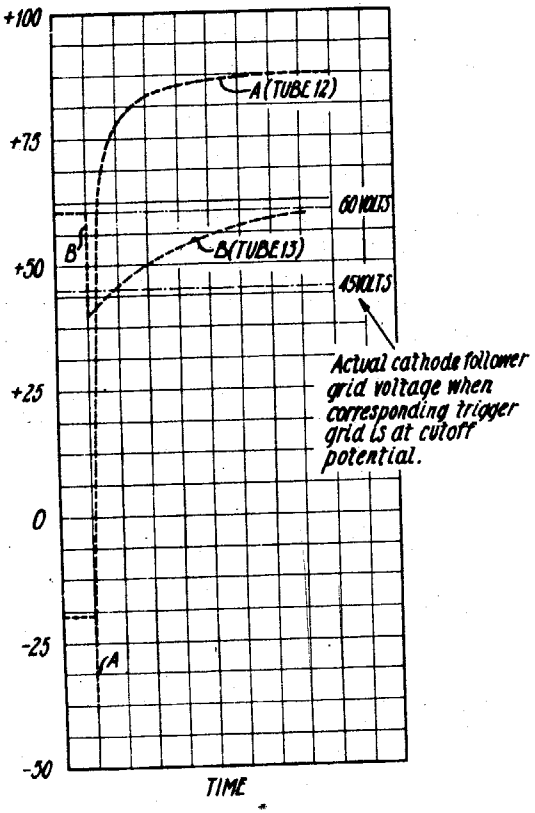
Fig. 5 is a graph illustrating the voltage on the control grids of certain tubes under certain assumed conditions.

This is shown clearly from inspection of Fig. 5 wherein the dotted line curve A represents the voltage on the control grid of tube 12 starting from minus 40 volts while the dotted line curve B represents the voltage on the control grid of tube 13 starting from plus 40 volts. These curves were traced from an oscilloscope and were obtained by increasing the negative bias voltages on the control grids of the tubes sufficiently to prevent the trigger from switching to its other stable condition in response to input pulses and therefore do not illustrate the actual voltages when the trigger is operating under normal conditions. Hence, as shrown by curves A and B, the voltages on the control grids of tubes 12 and 13 are shown as reaching final values of plus 87 volts and plus 60 volts, respectively. These curves are drawn to twice the scale of the curves actually traced from the oscilloscope.

The initial values of voltage, when the trigger is "on," are shown in Fig. 5. As is seen from curve B, before zero time is reached, the voltage at the control grid of tube 13 is plus 60 volts while, as is seen from curve A, that at the control grid of the tube 12 is minus 20 volts. At zero time, a twenty volt negative pulse is applied to the control grids of the tubes 13 and 12 which reduces the voltage at those grids to plus 40 volts and minus 40 volts, respectively. It is seen from Fig. 5, that the curves A and B cross, before either reaches the plus 45 volt line. The 45 volt line represents the cathode follower grid potential when the trigger grid is at cutoff bias. This means that the crossover occurs before either tube 10 or 11 has become conductive since the voltage on the cathode follower control grids must reach a value of plus 45 volts, to render the trigger tubes conductive.

Figure 6:
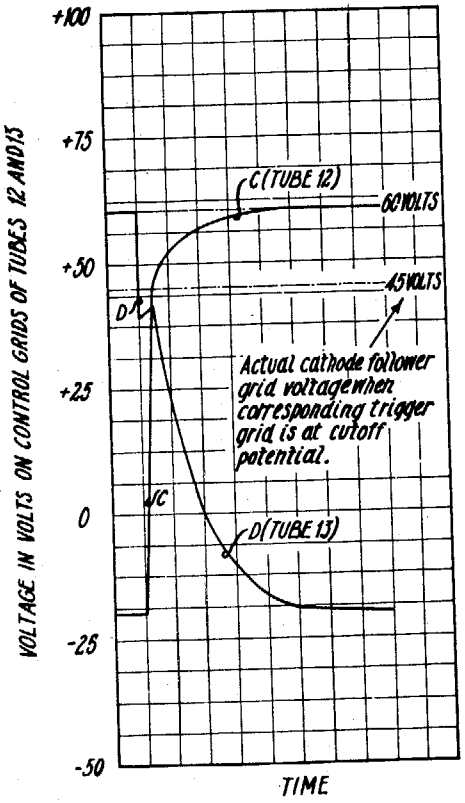
Fig. 6 is a graph illustrating the voltage on the control grids of certain tubes under actual operating conditions.

In actual operation, when the trigger flips, these dotted curves A and B of Fig. 5 are not obtained. This is because of the fact that the first tube which becomes conductive, causes the trigger to assume the stable condition corresponding to the conduction of that tube. Hence, the voltage on the control grid of the conductive cathode follower tube rises to a stable value of plus 60 volts and the voltage on the control grid of the other cathode follower tube decreases to a stable value of minus 20 volts. The solid line curves C and D of Fig. 6 are obtained under actual switching conditions and correspond respectively to the curves A and B, which were obtained when actual switching of the trigger was prevented. The actual voltage on the control grid of tube 12 when switching of the trigger from "on" to "off" occurs, is shown by the solid line curve C while the voltage on the control grid of tube 13 during the same period is shown by the solid line curve D.

As is seen, the curves showing the voltages on the control grids of tubes 12 and 13 during actual operation are approximately the same as when operation was prevented, if we exclude the portions occurring after the curve C crosses line 45. It is seen that the solid curve C ascends beyond the plus 45 volt line, almost immediately after it crosses the solid curve D. The curve B of Fig. 5 having much less slope than the curve A, would cross the plus 45 volt line later in time.

When the curve C ascends beyond the plus 45 volt line, the critical voltage is exceeded and tube 12 is rendered conductive. Hence, under actual flipping conditions, the voltage on the control grid of tube 12 continues to rise, not toward a final value of plus 87 volts as shown by dotted curve A of Fig. 5 but toward a value of plus 60 volts, as is seen from solid curve C of Figure 6. When tube 12 is thus rendered conductive, its cathode voltage increases rapidly, which voltage is transferred over capacitor 26 and resistors 45 and 43 to the control grid of tube 10 to render it conductive. Its plate voltage decreases sharply and this decreased voltage is transferred over conductor 28 and parallel connected resistor 29 and capacitor 30, to the control grid of tube 13. This is seen from curve D representing the voltage on the control grid of tube 13, which declines sharply, as the curve C ascends beyond the plus 45 volt line. As is seen from curve D, the voltage at the control grid of tube 13 decreases until it reaches a final value of minus 20 volts.

The curves of Fig. 6 showing the voltage on the control grids of the cathode follower tubes 12 and 13 when the trigger is switched from "on" to "off" may also be employed to represent the voltage on these controy grids when the trigger is switched from "off" to "on." When the trigger is switched from "off" to "on," the voltage on the control grid of tube 12 would be represented by the curves B and D and the voltage on the control grid of tube 13 by the curves A and C.

As set forth mathematically above, the input capacitance of a triode trigger tube is greater than the sum of the grid-cathode and grid-plate capacitance but the input capacitance of the cathode follower tubes 12 and 13 is much less than the sum of the grid-cathode and grid-plate capacitance. The resulting permissible decrease in the capacitance used between the plates of the trigger tubes and the control grids of the cathode follower tubes means that the RC circuit used in the novel trigger circuit of the invention has a much lower time constant than that used in the conventional trigger. In other words, the switching of the present trigger requires less time and the trigger is therefore capable of higher speed operation. This is graphically represented by the extremely steep slope of the curve C showing the rapid increase of the control grid voltage on the tube which is switched from the non-conductive to the conductive state.

Resuming the detailed operation of the circuit of Fig. 2, when the second negative pulse is applied to the input terminal 37 the voltage on the plates of tubes 10 and 11 is again decreased. A negative pulse is transferred from the plate of tube 10 over the conductor 28 and parallel connected, resistor 29 and capacitor 30, to the control grid of the tube 13. However, since tube 13 is now non-conductive, this negative pulse has substantially no effect. At the same time, a negative pulse is transferred from the plate of tube 11 over the conductor 33 and parallel connected resistor 34 and capacitor 35, to the control grid of conductive tube 12. This control grid is driven below cutoff and tube 12 rendered non-conductive to produce a steep negative pulse at its cathode. This steep negative pulse is transferred over capacitor 26 and resistors 45 and 43 to the control grid of conductive tube 10 so that this control grid is driven beyond cutoff to render the tube 10 non-conductive. At this point in the switching of the trigger, as in its switching from the "on" to the "off" condition, all four tubes 10, 11, 12 and 13 are non-conductive.

The voltages on the control grids of tubes 12 and 13 rise toward a final value, under the control of their respective RC circuits. It should be noted that the initial and final voltage values of the control grid of tube 12 will now correspond to those values set forth above for the control grid of tube 13, when the trigger was switched from the "on" to the "off" condition, in response to the first negative pulse applied to the input terminal 37. Also, the initial and final voltage values of the control grid of tube 13 will now correspond to those values given for the control grid of tube 12, when the trigger was switched from the "on" to the "off" condition, in response to the first negative pulse applied to input terminal 37.

In the same manner as that described in connection with tubes 10 and 12, when switched by the first negative pulse, the voltage on the control grid of tube 13 rises above the critical value and that tube is rendered conductive. When tube 13 becomes conductive, the voltage on the control grid of tube 11 rises above cutoff and renders it conductive, to place the trigger in the "on" condition.

Subsequent negative pulses applied across input terminal 37 and zero volt line 16, cause the trigger to switch from "on" to "off" and vice versa, alternately, as in response to the first and second negative pulses, respectively.

Referring to Fig. 3, the power supply arrangement is different from that used in Fig. 2. The plus 250 volt line 20 of Fig. 2 is replaced by the plus 150 volt line 49 of Fig. 3. The cathodes of tubes 10 and 11 are still connected to a zero volt line 16 but the tubes 12 and 13 are connected via the resistors 24 and 25, respectively, to a minus 10 volt line 50 while the grids of tubes 12 and 13 are connected via resistors 36 and 31, respectively, to the minus 150 volt line 51. Further, the cathode of tube 12 is directly connected to the control grid of tube 10 by conductor 52 while the cathode of tube 13 and the control grid of tube 11 are similarly connected by the conductor 53.

Figure 4:
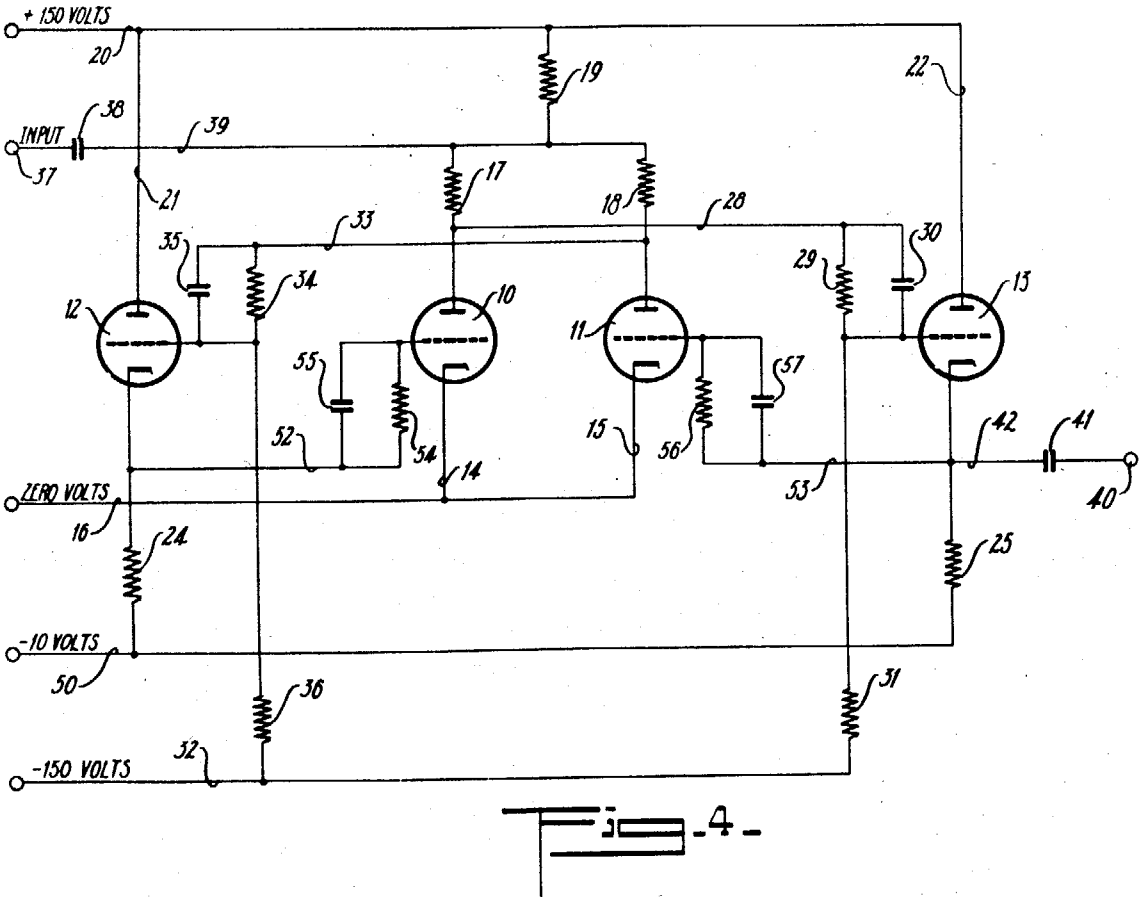
Fig. 4 is a circuit diagram of a further embodiment, requiring a fewer number of voltage supply lines.

Referring to Fig. 4, the same circuit as in Fig. 3 is illustrated except that the cathode of tube 12 is connected to the control grid of tube 10 by means of a conductor 52 and also a parallel connected resistor 54 and capacitor 55. The cathode of tube 13 is also connected to the control grid of tube 11 through a conductor 53 and a parallel connected resistor 56 and capacitor 57. Resistors 54 and 56 each have a value of 20,000 ohms and the capacitors 55 and 57 each have a value of 0.00005 microfarad. Resistors 54 and 56 serve to provide a safe current limit through the control grids of tubes 10 and 11, respectively, when these tubes are in a stable conductive condition. The capacitors 55 and 57 provide a low impedance path for the higher order harmonics present in the steep wave front pulses normally transferred from the cathodes of the tubes 12 and 13 to effect switching of the trigger tubes 10 and 11.

While the circuit shown in Fig. 2 illustrates one arrangement of the novel high speed trigger of the invention using a minimum number of supply lines, a wide variety of arrangements may be used without departing from the teachings of the invention. For example, in Fig. 4, the minus 10 volt line 50 can be eliminated, cathode resistors 24 and 25 connected to the zero volt line 16 and grid bias resistors connected in series with but intermediate the resistors 54 and 56 and the minus 150 volt line 32. Such will require only two voltage supplies and the voltage dividers, each of which is associated with the cathode of one of the cathode follower tubes and the control grid of one of the trigger tubes, permitting a wide choice of resistor values.

In each of Figs. 2, 3 and 4, the circuit arrangement produces a lower time constant, by far, than in the conventional dual-tube trigger, as expressed succinctly in the mathematical discussion above. Also, since the cathode follower has an extremely low output impedance, it is capable of driving the trigger grid to precisely reproduce any voltage variation applied to the cathode follower grid even though the cathode follower load is appreciable.

Also, the trigger can be operated over a wide range of supply voltages. For example, the trigger will operate with plate supply voltage as low as plus 16 volts and grid bias supply voltage of minus 20 volts. With a plate supply voltage of plus 100 volts and a grid bias supply voltage of minus 100 volts the trigger was operated satisfactorily up to 1.39 megacycles. The maximum speed of operation was 1.6 mc., using plus 210 and minus 107 volts.

Although miniature triodes of the 12AU7 type were employed, and particular values of components were recited herein, it is to be understood that the invention is by no means limited to such tubes and component values but that any suitable type tube and values of components may be employed without departing from the teachings of the invention.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A trigger circuit including first and second trigger tubes alternately conductive and non-conductive and vice versa to represent two stable conditions; plate resistors in the plate circuit of said tubes; a connection from said plate circuit to a source of pulses for effecting a change in the stable condition of said trigger; third and fourth vacuum tubes each having their plates connected directly to a voltage source and their cathodes connected to another voltage source through a resistor in the cathode circuit of each; a resistor and capacitor in parallel between the plate of said first tube and the control grid of said third tube for rendering said third tube conductive when said first tube is non-conductive and rendering said third tube non-conductive when said first tube is conductive; a connection from the cathode of said third tube to the control grid of said second tube for rendering said second tube conductive and non-conductive, respectively, as a result of the conduction and non-conduction of said third tube, said connection including a resistor and capacitor in parallel; a resistor and capacitor in parallel between the plate of said second tube and the control grid of said fourth tube for rendering said fourth tube conductive when said second tube is non-conductive and rendering said fourth tube non-conductive when said second tube is conductive, and a connection from the cathode of said fourth tube to the control grid of said first tube for rendering said first tube conductive and non-conductive, respectively, as a result of the conduction and non-conduction of said fourth tube, said connection including a resistor and capacitor in parallel.

2. The circuit of claim 1 including bias resistors connected to the control grids of the tubes.

3. A trigger circuit including first and second trigger tubes alternately conductive and non-conductive and vice versa to represent two stable conditions; a resistor connected at one end to the plate of each tube; a resistor connected to a source of plate supply voltage at one end and at its other end to the other ends of the resistors connected to the plates of the tubes; third and fourth tubes each having their plates connected directly to said source of plate supply voltage; a cathode voltage source connected directly to the cathodes of said trigger tubes and through resistors to the cathodes of the third and fourth tubes; a resistor and capacitor in parallel between the plate of said first tube and the control grid of said third tube for rendering said third tube conductive when said first tube is non-conductive and rendering said third tube non-conductive when said first tube is conductive; a resistor and capacitor in parallel between the plate of said second tube and the control grid of the fourth tube for rendering said fourth tube conductive when said second tube is non-conductive and rendering said fourth tube non-conductive when said second tube is conductive; a capacitive connection from the cathodes of the third and fourth tubes to the control grids of the second and first tubes, respectively; control grid bias resistors connected from the control grids of said tubes to a source of voltage and a resistive connection from the control grid bias resistors of the first and second tubes to the cathodes of the fourth and third tubes respectively.

*4. An electronic switching circuit including first and second grid controlled tubes, alternately automatically conductive and non-conductive and vice versa, and third and fourth grid controlled tubes corresponding to said first and second grid controlled tubes respectively and operating as a cathode follower, the third tube having its control grid connected through a resistor and capacitor in parallel only to said first grid controlled tube and the fourth tube having its control grid connected through a resistor and capacitor in parallel only to said second grid controlled tube so that a change in the conduction of either of said first and second tubes controls the conduction of the cathode follower tube having its control grid connected thereto.*

*5. In an electronic switch having two grid controlled tubes and two stable conditions alternately assumed, third and fourth grid controlled tubes, each operated as a cathode follower, the third tube having its control grid connected only to said first grid controlled tube through a resistor and capacitor in parallel and the fourth tube having its control grid connected only to said second grid controlled tube through a resistor and capacitor in parallel; a first connection comprising a resistor and a capacitor in parallel between the cathode of the third tube and the control grid of the second tube; and a second connection comprising a resistor and a*

*capacitor in parallel between the cathode of the fourth tube and the control grid of the first tube.*

*6. In a trigger circuit having two grid controlled tubes and two stable conditions alternately assumed, a cross-connection from the anode of each tube to the control grid of the other, each said cross-connection including an inter-electrode space of a thermionic tube having at least a cathode, a grid, and an anode, an electrical connection comprising a capacitor and resistor in parallel between the cathode of the thermionic tube and the grid of the respective grid controlled tube, and a connection between the grid of the thermionic tube and the anode of the respective grid controlled tube.*

*7. A trigger circuit comprising a first and second grid controlled electron discharge device each having at least an anode and an anode load resistor, a first and second cathode follower having at least a grid, a cathode, an anode and a resistor connected to the cathode and in series with a source of anode potential and the cathode follower inter-electrode space, means connecting the grid of the first cathode follower with the junction of the first discharge device anode and the anode load resistor, means comprising a capacitor and resistor in parallel connecting the cathode of the first cathode follower to the grid of the second grid controlled electron discharge device, means connecting in like fashion the second cathode follower to the anode of the second electron discharge device and the grid of the first electron discharge device.*

*8. In an electronic switching circuit, a first and a second vacuum tube each having at least an anode, a cathode and a control electrode, a source of anode potential and an impedance connected between the positive pole of the said anode potential source and each of the anodes of the said first and second vacuum tubes, a first and a second cathode follower each having at least a cathode, a grid, an anode and a load resistance in series with the cathode, a connection comprising a capacitor and resistor in parallel between the grid of the first cathode follower and the anode of the first electron vacuum tube, a connection from the first cathode follower load resistance to the grid of the second vacuum tube, a connection comprising a capacitor and resistor in parallel between the anode of the second vacuum tube and the grid of the second cathode follower, a connection between the second cathode follower load resistance and the grid of the first electron vacuum tube, and means for impressing the potential of the anode potential source across each series network comprising a cathode follower inter-electrode space and the respective cathode follower load resistance.*

CARL A. BERGFORS.

References Cited in the file of this patent or the original patent

UNITED STATES PATENTS

| Number | Name | Date |
|---|---|---|
| 2,404,047 | Flory et al. | July 16, 1946 |
| 2,441,579 | Kenyon | May 18, 1948 |
| 2,454,815 | Levy | Nov. 30, 1948 |
| 2,540,539 | Moore | Feb. 6, 1951 |
| 2,550,116 | Grosdoff | Apr. 24, 1951 |

FOREIGN PATENTS

| Number | Country | Date |
|---|---|---|
| 587,940 | Great Britain | May 9, 1947 |